United States Patent [19]

Sugiura et al.

[11] Patent Number: 5,479,201
[45] Date of Patent: Dec. 26, 1995

[54] OPTICAL BEAM SCANNER WITH CIRCUIT BOARD MOUNTED ELEMENTS

[75] Inventors: Yoshinori Sugiura, Kawasaki; Ryosuke Kaku, Yokohama; Shin Mogi, Machida; Jun Azuma, Kawasaki, all of Japan

[73] Assignee: Canon Kabushiki Kaisha, Tokyo, Japan

[21] Appl. No.: 389,686

[22] Filed: Feb. 16, 1995

Related U.S. Application Data

[63] Continuation of Ser. No. 297,909, Aug. 31, 1994, abandoned, which is a continuation of Ser. No. 115,246, Sep. 1, 1993, abandoned, which is a continuation of Ser. No. 680,090, Apr. 3, 1991, abandoned.

[30] Foreign Application Priority Data

Apr. 6, 1990 [JP] Japan .................. 2-91659
Apr. 6, 1990 [JP] Japan .................. 2-91660

[51] Int. Cl.⁶ .................................... B41J 2/435
[52] U.S. Cl. ............................... 347/257; 347/242
[58] Field of Search .................... 347/257, 242, 347/134; 359/196, 198

[56] References Cited

U.S. PATENT DOCUMENTS

| | | |
|---|---|---|
| 4,147,401 | 4/1979 | Reichl et al. . |
| 4,367,912 | 1/1983 | Kitamura . |
| 4,528,573 | 7/1985 | Beherns et al. ............ 346/108 |
| 4,800,401 | 1/1989 | Sato et al. ................. 346/108 |
| 4,868,673 | 9/1989 | Negoro ..................... 358/296 |
| 4,911,532 | 3/1990 | Hidaka . |
| 4,977,412 | 12/1990 | Komori et al. ............. 346/108 |
| 5,019,837 | 5/1991 | Schwarz .................... 346/108 |

FOREIGN PATENT DOCUMENTS 217325 4/1987 European Pat. Off. .
1-251050 10/1989 Japan .

*Primary Examiner*—Mark J. Reinhart
*Attorney, Agent, or Firm*—Fitzpatrick, Cella, Harper & Scinto

[57] ABSTRACT

An optical scanning apparatus has a light source unit, a first circuit board provided with the light source unit, a deflector for deflecting light beam from the light source unit, and a second circuit board provided with the deflector. The first circuit board and the second circuit board are connected electrically in such a manner that the positions thereof can be adjusted mechanically. Hence the optical beam scanner is made compact to obtain a sufficient bending strength and precision for an enhanced system reliability.

44 Claims, 10 Drawing Sheets

OPTICAL BEAM SCANNER WITH CIRCUIT BOARD MOUNTED ELEMENTS

This application is a continuation of application Ser. No. 08/297,909 filed Aug. 31, 1994, now abandoned, which was a continuation of application Ser. No. 08/115,246 filed Sep. 1, 1993, now abandoned, which was a continuation of application Ser. No. 07/680,090 filed Apr. 3, 1991, now abandoned.

BACKGROUND AND SUMMARY OF THE INVENTION

The present invention relates to an optical beam scanner such as a laser copying machine, laser beam printer, etc.

For a laser beam printer or the like, an optical beam scanner is employed to perform the deflection scanning of the laser beam. FIG. 1 and FIG. 2 illustrate an example of the optical beam scanner employed for a laser beam printer. As shown in FIG. 1, a rotor unit 2 is arranged on the optical path of the laser beam emitted from a laser unit 1. To both units 1 and 2, a light source circuit board 1A and a scanner circuit board 2A respectively fixed, each with electronic circuits and others being arranged individually. In the boards 1A and 2A, electric connectors 1B and 2B are respectively installed to connect each of them with a control circuit which is not shown in FIG. 1.

Then, both units 1 and 2 are coupled to each other by a housing 3 as shown in FIG. 2. In the laser unit 1, a laser light source 11 is connected to the light source circuit board 1A electrically by soldering lead lines, etc. The semiconductor laser light source 11 is fixed to a base 12 with a spring member 13, and a through hole 14a is provided in a holder 14 which is mounted on the base 12 in such a manner that the position thereof can be adjusted. In this through hole 14a, a barrel 15 is installed slidably in the longitudinal direction. Also, in the barrel 15, a collimator lens 16 is installed to converge the light flux from the laser light source 11.

In assembling the laser unit 1, the holder 14 is mounted by adjusting to match the center axes of the through hole 14a and the collimator lens 16 on a jig which is not shown in FIG. 2, and while observing the shape of the laser beam to be emitted, the position of the base 12 is adjusted so that the base 12 and the holder 14 are fixed at an optimum position by screws, etc. to complete the adjustment of the optical axes of laser source 11 and collimator lens 16. The laser unit 1 already adjusted and the holder 14 are fixedly fitted into a laser unit installation hole 3a provided in the housing 3.

Meanwhile, in the rotor unit 2, a high-speed revolution motor 21 is electrically connected to the scanning circuit board 2A. On a rotor 22 fixed to the axis of the high-speed revolution motor 21, a rotary mirror 24 is fixed with a washer 23. The rotor unit 2 is fixed by fitting the high-speed revolution motor 21 into a rotor unit installation hole 3b provided in the housing 3.

The laser beam emitted from the laser unit 1 is incident on the reflecting mirror surface 24a and 24b of the rotary mirror 24, and the deflection scanning is performed by the rotation of the rotary mirror 24. While the scanning is performed on a photosensitive member 5 at a constant speed by the function of a f-θ lens 4, the positional adjustment of the laser unit and the rotor unit 2 has traditionally been made at this juncture in such a manner that the laser unit installation hole 3a and the rotor unit installation hole 3b provided in the housing 3 are machined under the severe precision control in manufacturing in order to obtain the accurate mounting positions and the center axis matching, and that when the laser unit 1 and the rotor unit 2 are just fitted into the laser unit installation hole 3a and the rotor unit installation hole 3b respectively, the optical position adjustment therefor is complete. Traditionally, therefore, the manufacturing of the housing 3 has been carried out often by machining an aluminum diecasting or forming a resin mold.

However, as the above describes, if the light source circuit board 1A and the scanner circuit board 2A are separated and are electrically independent, the connection to the control circuit, etc., which are not shown in FIG. 1, should be made separately, resulting not only in the increased number of lead lines but in the hindrance of the miniaturization and production efficiency, not to mention the susceptivity to the noise problem, etc.

Also, in manufacturing the housing 3, aluminum should be machined to obtain the accurate angles and positions, which requires an extremely high manufacturing cost. For the manufacture by the use of the resin mold formation, which has been more widely employed in recent years in order to attempt the cost down and meet the requirements for a lighter weight product, it is necessary to use a highly precise metal die in view of the maintenance of the accurate pattern drawings and precision gradients and positions. This still requires an expensive manufacturing cost.

In this respect, therefore, an image formation apparatus is proposed as disclosed in Japanese Laid-Open Patent Application 1-251050, wherein a first circuit board having parts for a laser driving system and a second circuit board having parts for a scanning system are arranged in the housing of a laser exposure unit at shifted positions to each other, and these two kinds of cirucit boards are interrelatedly connected electrically and mechanically by the connectors provided on the respective circuit boards. The structure thereof is illustrated in FIG. 3.

Inside the housing main body 86, a laser driving assembly 150 and a mirror driving assembly 151 are arranged as shown in FIG. 3. On the printed-circuit board (the first circuit board) 152 which is the base for the laser driving assembly 150, a semi-conductor laser oscillator 153 as a laser light source, a collimator system optical unit 154 with built-in collimator lens and prism, and various electronic parts for the laser driving system, which form the circuits required to drive the laser oscillator 153, are installed. In addition, there is provided on this circuit board 152 a connector 155 having terminal pins to connect the laser driving assembly 150 to the mirror driving assembly 151 mechanically and electrically. The laser output end of the collimator system optical unit 154 faces the reflection surface of a polygon mirror 201.

In the mirror driving assembly 151, the polygon mirror 201 which constitutes a polygon scanner 200, a motor 202 for driving this mirror 201, and various scanner system parts required to control the rotation of this motor 202 are installed. The motor 202 is a brushless DC motor, for example. On the printed-circuit board (the second circuit board) 203 which is the base for the mirror driving assembly 151, a connector 204 is provided to connect with the connector 155 of the aforesaid laser driving assembly 150. The holes of the connector 204 are opened downwards. Consequently, the pins of the connector 155 of the laser driving assembly 150 are inserted from the lower side of this connector 204.

As the above describes, the two kinds of units 150 and 151 are connected with each other electrically and mechanically through the connectors 155 and 204.

Nevertheless, with the aforesaid laser exposure unit shown in FIG. 3, it is impossible to adjust 10 the positions of the boards themselves after having been connected because the two kinds of circuit boards are connected through the connectors. Therefore, it is necessary to machine and install the parts with high-precisions beforehand.

An object of the present invention is to solve each of the aforesaid problems and provide an optical beam scanner which is compact without any complicated wirings and which can be manufactured without such a high-precision machining.

In order to achieve the aforesaid object, an optical beam scanner according to the present invention is characterized in that in the optical beam scanning apparatus having a laser light source to output laser beam and an optical scanning unit to deflect the laser beam, a light source circuit board with the laser light source fixed thereto and a scanning circuit board with the optical scanning unit fixed thereto are connected electrically in such a manner that the positions thereof can be adjusted mechanically.

Since the optical beam scanner of the above-mentioned structure has the light source driving circuit and the scanner driving circuit on the same circuit board, or the light source circuit board and scanner circuit board are directly connected electrically, it is possible to unify the wirings for the connection of the control circuit, etc. 10 as well as to make the apparatus compact. Also, it is unnecessary to perform such a high-precision machining because the light source circuit board with the light source fixed thereto and the scanner circuit board with the optical scanning unit fixed thereto are directly connected in such a manner that the relative position thereof can be adjusted mechanically.

DESCRIPTION OF THE PREFERRED EMBODIMENTS

Figure 1:
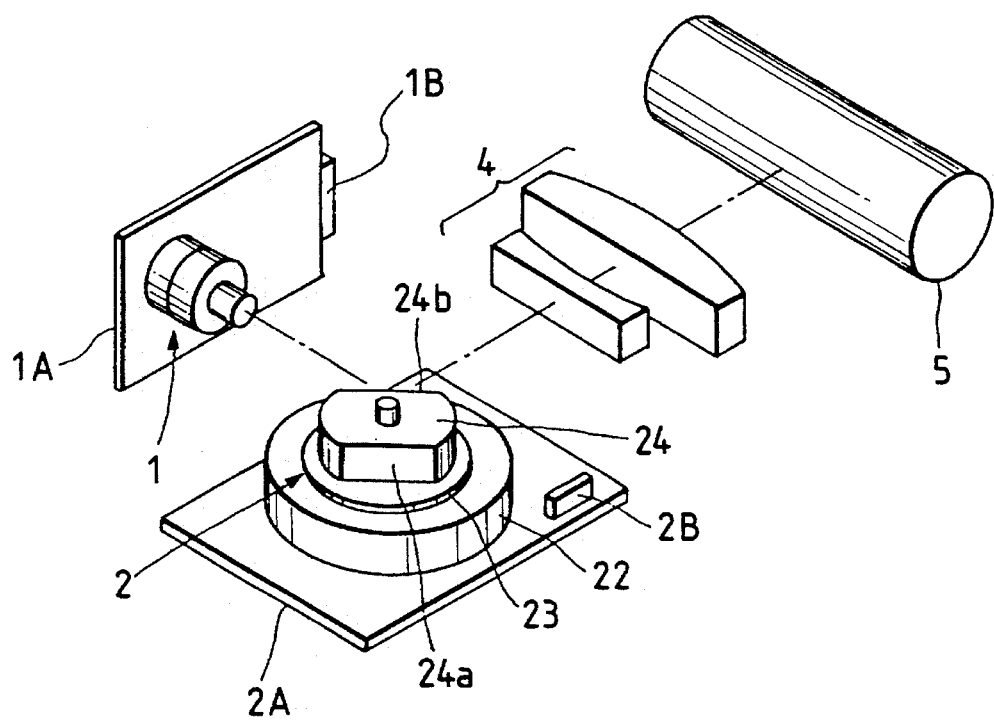
FIG. 1 is a perspective view showing a conventional optical beam scanner.
Figure 2:
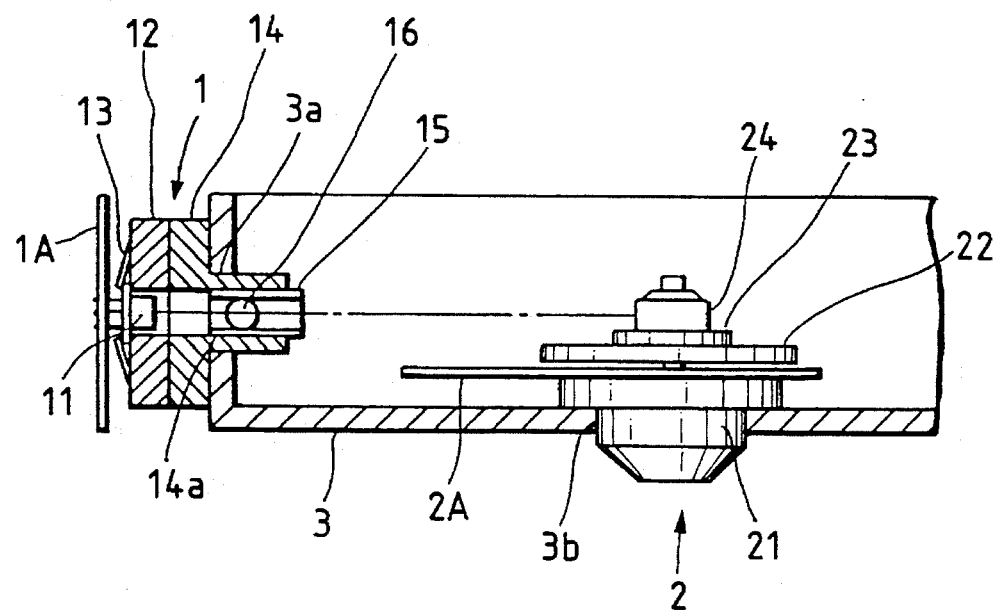
FIG. 2 is a cross-sectional view showing the conventional state of the installation.
Figure 3:
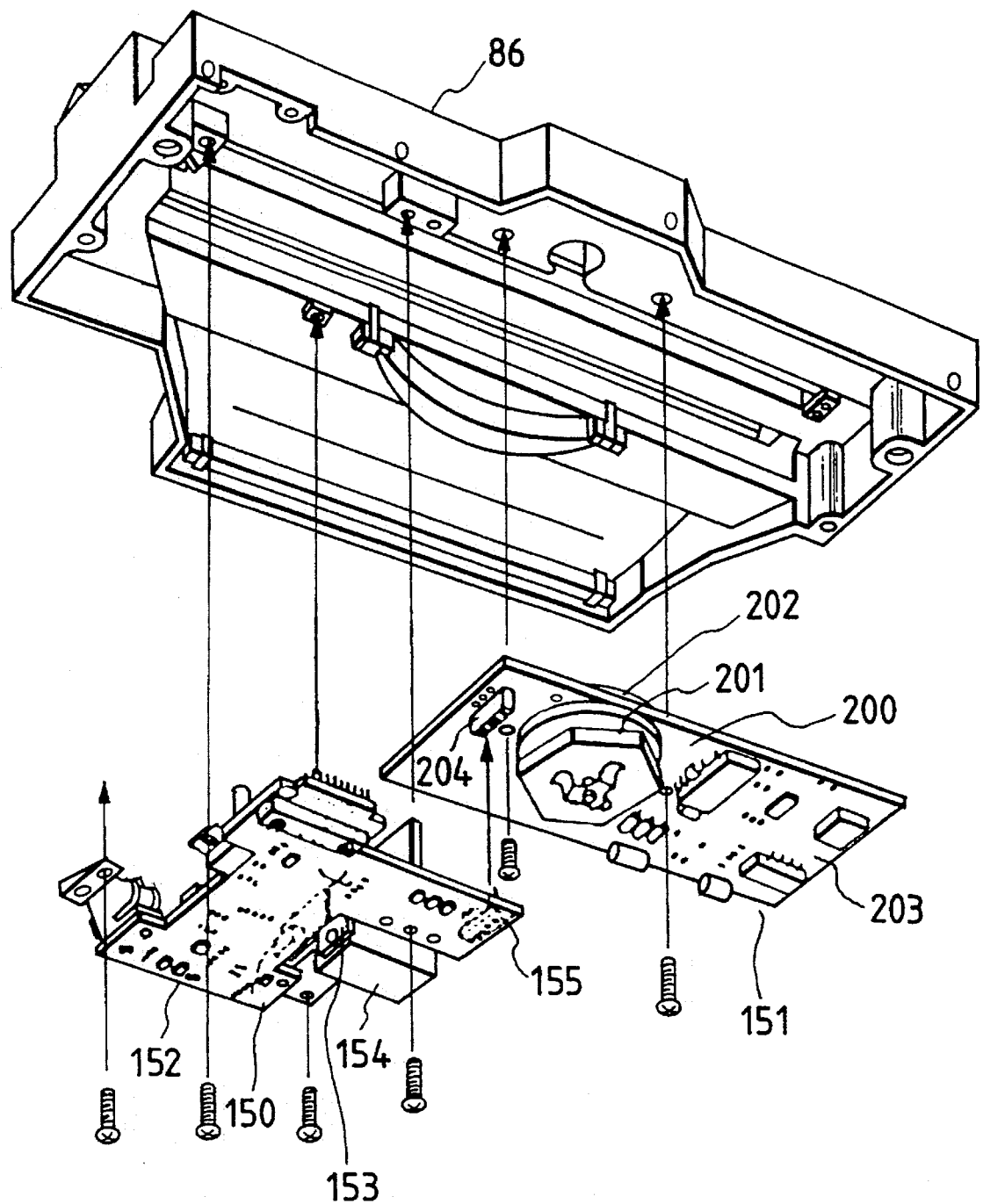
FIG. 3 is a view illustrating a laser exposure unit disclosed in Japanese Laid-Open Patent Application 1-251050.

Hereinafter, the present invention will be described in detail in accordance with embodiments shown in the accompanying drawings. In this respect, the same reference marks in FIG. 1 and FIG. 2 designate the same or equivalent members.

Figure 4:
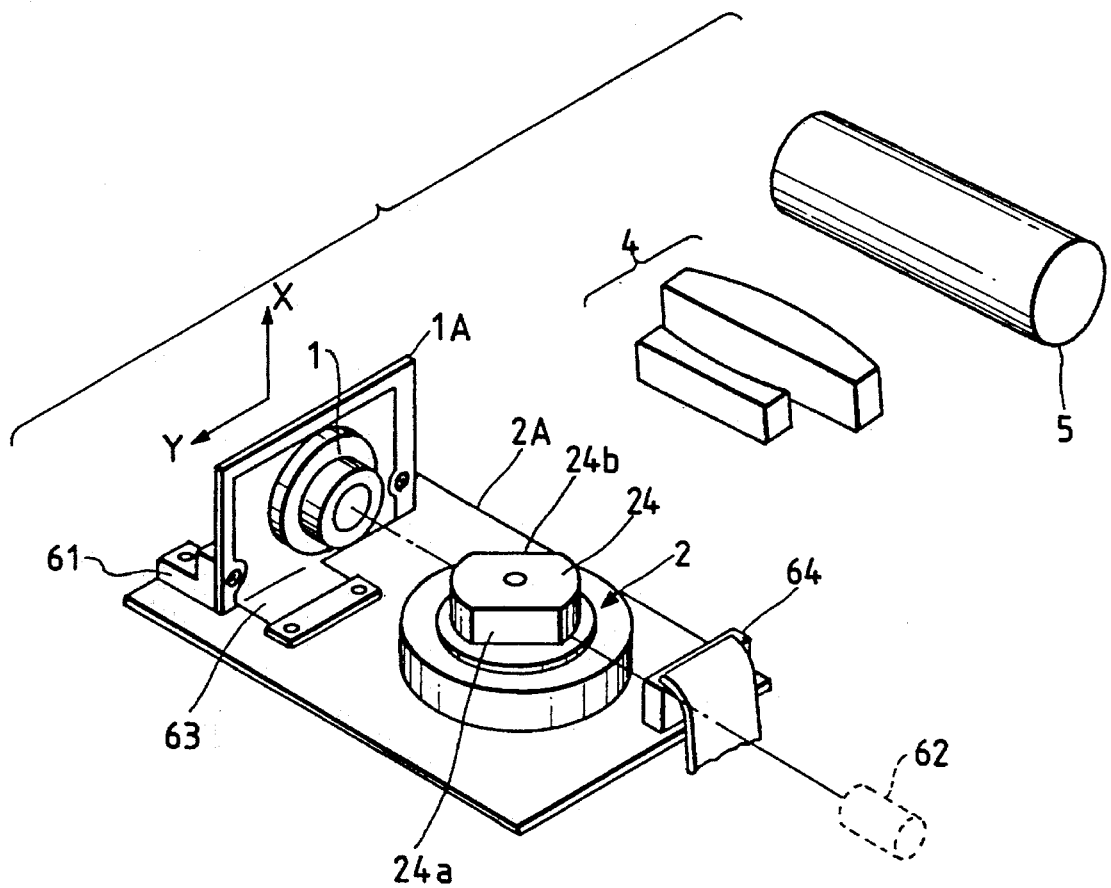
FIG. 4 is a perspective view showing a first embodiment of an optical beam scanner according to the present invention.

FIG. 4 is a perspective view showing the structure of a first embodiment of an optical beam scanning apparatus according to the present invention, in which a laser unit 1 is mounted on a light source circuit board 1A; a rotor unit 2 is mounted on a scanner circuit board 2A; and the light source circuit board 1A and the scanner circuit board 2A are coupled through a right angled member 61 having an L cross section. Here, as in the conventional case, the adjustments of the optical axes and focusings of the semiconductor laser light source 11 and the collimator lens 16 of the laser unit 1 may be completed in advance. In fixing the right angled member 61 to the light source circuit board 1A by screws, etc., the adjustment is possible at the mounting position within the range of play in X-Y cross-section in FIG. 4, and the adjustment of the incident position of the laser beam output from the laser unit 1 to the rotor unit 2 can be performed by adjusting the mounting of the light source circuit board 1A to be fixed while detecting the irradiating position of the laser beam.

Thus, the light source circuit board 1A and the scanner circuit board 2A are structured to connect them electrically by soldering, etc. through a flexible board 63 so that the relative position thereof can subsequently be adjusted mechanically.

Figure 5:
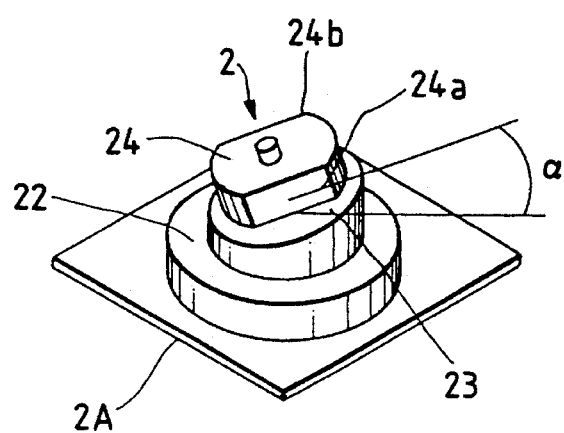
FIG. 5 is a perspective view showing a rotor unit.

The detection of the aforesaid irradiation position of the laser beam is possible by locating a photosensor 62 at a given position in a state where the rotary mirror 24 of the rotor unit 2 is removed as indicated by the dotted lines in FIG. 4. In this respect, the reflecting mirror surfaces 24a and 24b of the rotary mirror 24 are parallel to each other as shown is FIG. 5, an even if the washer 23 is slanted at a minute angle α, the angles of reflection of the reflecting mirror surfaces 24a and 24b are substantially equal by arranging the reflecting mirror surfaces 24a and 24b to be along the slant so that these surfaces are installed in parallel with the slanting direction, and it becomes unnecessary to employ any special optical system for the tilt correction using a toric lens, etc. because there are no fluctuations generated in the pitches of scanning lines.

On the other hand, when the light source circuit board 1A and the scanner circuit board 2A are coupled mechanically, the electrical coupling is arranged in such a structure that an electric contact between them is always secured within the range of allowance to adjust the fixing position thereof by, for example, providing them with a spring contact point in a wide area prepared in the direction of its force to be applied, or as shown in FIG. 4, a flexible board 63 is used to widen the contacting area by utilizing the flexibility of this flexible board 63.

Now, when a recording is performed by a modulated laser beam under such the structure, the main scanning is carried out by the laser beam on the photosensitive member 5 by the rotation of the rotary mirror 24 and the subscanning is carried out as the photosensitive member 5 is driven to rotate around the axis of its cylinder. Hence, the electrostatic latent image is formed on the surface of the photosensitive member 5.

In the circumference of the photosensitive member 5, there are arranged a corona discharger for charging the surface of the photosensitive member 5 evenly; a developing device for actualizing the electrostatic latent image formed on the surface of the photosensitive member 5 into a toner image; and a transferring corona discharger (neither of them shown) for transferring the aforesaid toner image to a recording sheet, and some others. With the functions of these members, a recording information corresponding to the laser beam generated by the laser unit 1 is printed on a recording Sheet.

With a structure such as this, it is possible to remove the members which are difficult to manufacture due to the high-precision requirements as in the conventional case, and the apparatus can be manufactured at a low cost. Also, unlike the conventional system in which the electric connectors 1B and 2B are separately installed on the light source circuit board 1A and the scanner circuit board 2A, which necessitates the wirings to be also separately arranged for the control circuit (not shown), it is possible to make the connection by one electric connector 64 only, so that the number of wirings between the laser unit 1 and the rotor unit 2 can be reduced.

Figure 6:
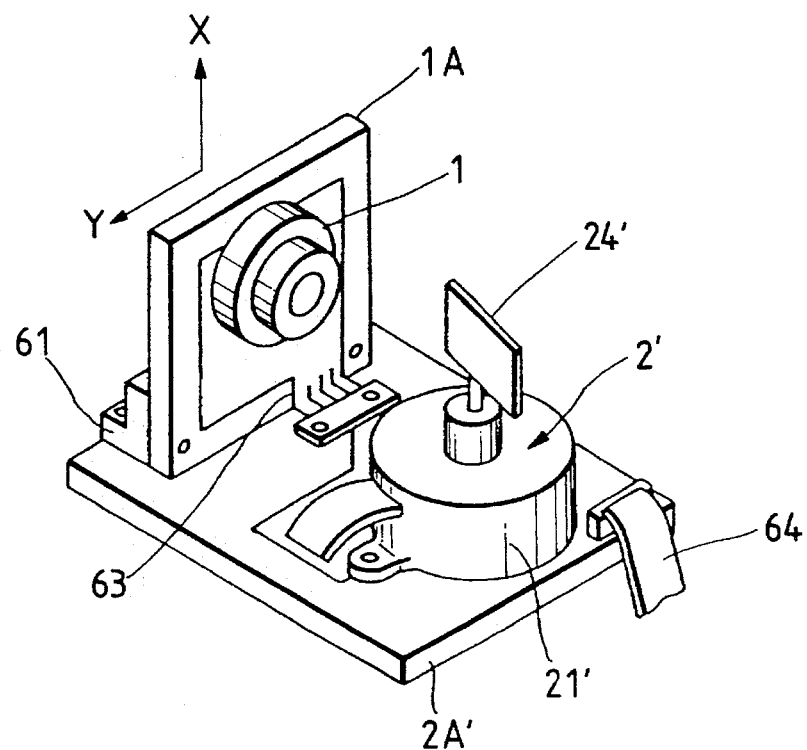
FIG. 6 is a perspective view showing a second embodiment of an optical beam scanner according to the present invention.

FIG. 6 shows a second embodiment of an optical scanning apparatus according to the present invention, which is almost the same as the first embodiment with the exception of a galvanomirror unit 2' employed in place of the rotor unit 2. The galvanomirror unit 2' comprises a scan driving unit 21' having a reciprocating rotation axis, and a plane mirror 24' fixed to the rotation axis. The function of the deflection scanning of the incident laser beam on the plane mirror 24' is the same as that of the rotor unit 2 described earlier.

In the second embodiment, the laser unit 1 and the galvanomirror unit 2' are respectively fixed to the light source circuit board 1A and the scanner circuit board 2A; and the light source circuit board 1A and the scanner circuit board 2A' are coupled through the right angled member 61 having an L cross section. Thus, using the galvanomirror unit 2' it is possible to obtain the same effect as in the case of using the rotor unit 2.

As in the first embodiment described earlier, the light source circuit board 1A and the scanner circuit board 2A' in the second embodiment are electrically connected by soldering, etc. through the flexible board 63, and the light source circuit board 1A is mounted in such a manner that its mounting position can be adjusted in a X-Y cross section in. FIG. 6.

Figure 7:
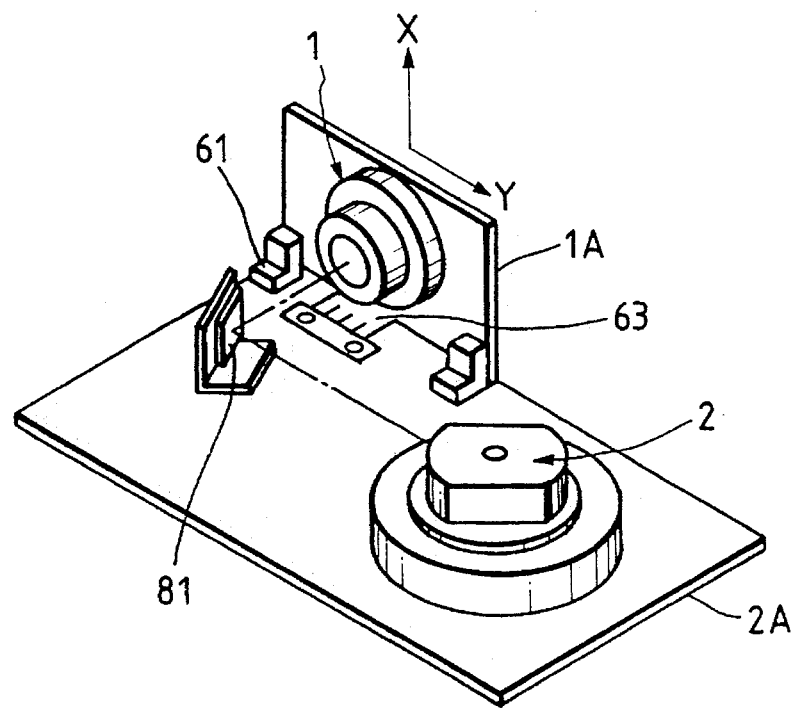
FIG. 7 is a perspective view showing a third embodiment of an optical beam scanner according to the present invention.

FIG. 7 shows a third embodiment of an optical scanning apparatus according to the present invention, which is a variation of the first embodiment described earlier. To the structure of the previous embodiment, a plane mirror 81 is added, and the laser beam output from the laser unit 1 is reflected by the plane mirror 81 and then is incident On the rotary mirror 24 of the rotor unit 2. The third embodiment has an advantage that it can be employed where the arrangement is impossible as in the case of the first embodiment 10 due to the availability of the space required.

As in the aforesaid first embodiment, the light source circuit board 1A and the scanner circuit board 2A in the third embodiment are electrically connected by soldering, etc. through the flexible board 63, and the light source circuit board 1A is mounted in such a manner that its mounting position can be adjusted in a X-Y cross section in FIG. 7.

Figure 8A:
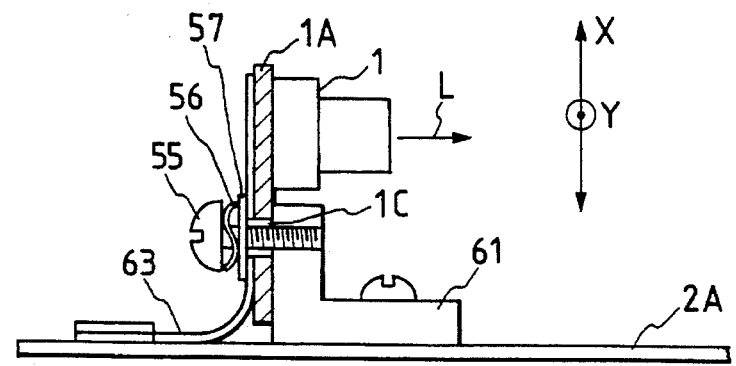
FIGS. 8A, 8B, and 8C are views showing the variations of the mounting position adjustment of a light source circuit board.
Figure 8B:
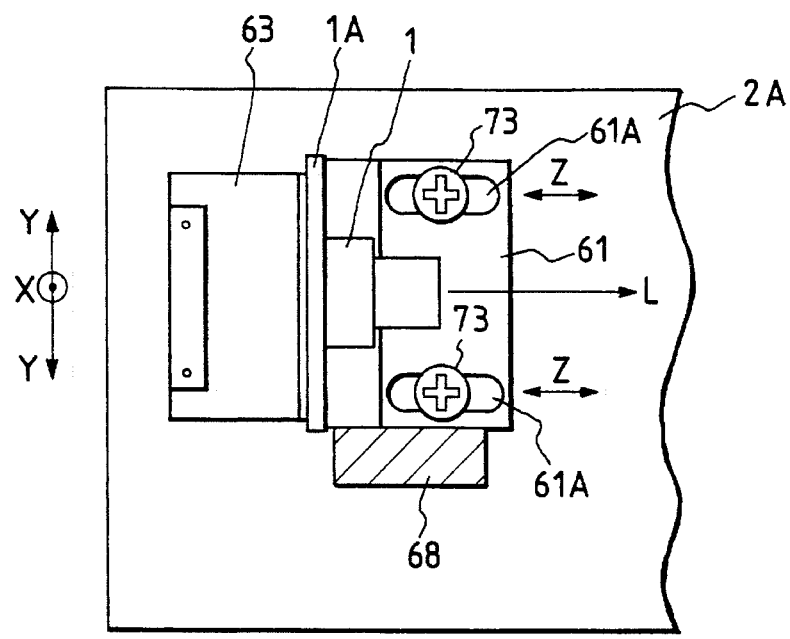
Figure 8C:
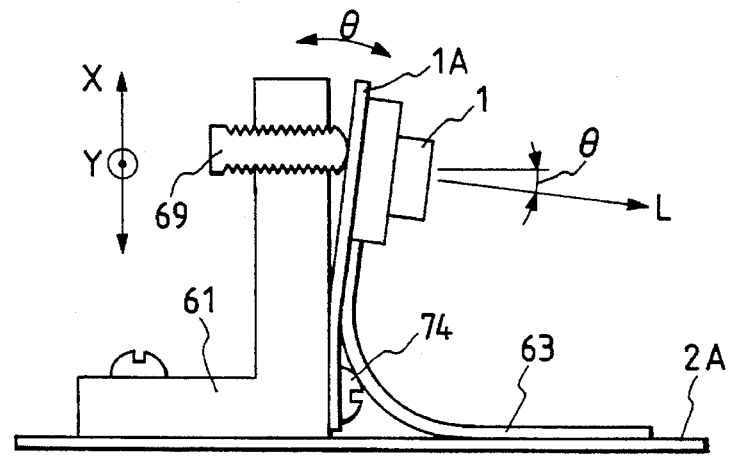

The variations of the mounting position adjustment for the light source circuit board 1A are examplified in FIGS. 8A, 8B, and 8C. Here, the vicinity of the mounting position of the laser unit 1 on the light source circuit board 1A is shown in an enlarged form.

In FIG. 8A, a hole 1C is provided for the light source circuit board 1A for the mounting position adjustment, and the inner diameter of the hole 1C is larger than the outer diameter of a fixing screw 55 (approximately by 0.5 mm). The light source circuit board 1A is fixed to the right angled member 61 by the fixing screw 55 with a flat washer 57 and a waving washer (spring washer) 56.

The mounting position adjustment of the light source circuit board 1A is carried out with the fixing screw 55 being loosened, and the laser unit 1 and the light source circuit board 1A are shifted in the X direction which is an in-surface of the paper and the Y direction which is orthogonal to the paper surface so as to adjust the axis of the laser beam L.

After the adjustment has been completed, the fixing screw 55 is tightened to enhance the spring force of the waving washer 56 to fix the position of the light source control board 1A.

FIG. 8B is a view observed from a X direction which is orthogonal to a Y-Z cross section including the Y direction and Z direction (axial direction). In the right angled member 61 to which the light source circuit board 1A and the laser unit 1 are fixed, slots 61A are provided in the Z direction. On the scanner circuit board 2A, a guide 68 is provided. The right angled member 61 is in contact with the guide 68 and moved in the Z direction as indicated in FIG. 8B for the adjustment. Thus, the laser unit 1 and the light source circuit board 1A are moved in the Z direction as indicated in FIG. 8B to adjust the output position of the laser beam L.

After the adjustment has been completed, a fixing screw 73 is tightened to fix the position of the right angled member 61.

In FIG. 8c, the light source circuit board 1A with the laser unit 1 fixed thereto is fixed to the right angled member 61 by a fixing screw 74. Then, by tightening a screw having an R shape at its leading end, the laser unit 1 is inclined towards the θ direction as indicated in FIG. 8C. Here, for the light source circuit board 1A, it is desirable to use a metal board having resiliency such as an iron plate, a silicon steel plate, etc.

As set forth above, an optical scanning apparatus according to the present invention is of a structure such that in the optical scanning apparatus having a laser light source for emitting laser beam and an optical scanning unit to deflect the laser beam, a light source circuit board to which the laser light source is fixed, and a scanner circuit board to which the optical scanning unit is fixed are electrically connected and mechanically coupled so as to enable the positioning adjustments thereof.

Also, it is desirable to arrange the structure so that the light source circuit board and the scanner circuit board are electrically connected through a flexible board to conduct the mechanical adjustment of the positions thereof.

In this way, it is possible to make the optical scanning apparatus of the present invention compact with ease and manufacture it without the high-precision machining.

In the embodiments described above, the light source circuit board and the scanner circuit board are separately provided, and each of them should be provided with a section through which both of them are connected. Therefore, the system is susceptible to electrical noises, causing it to malfunction. In order to avoid this, the light source circuit board and the scanner circuit board should be arranged on the same board.

Figure 9:
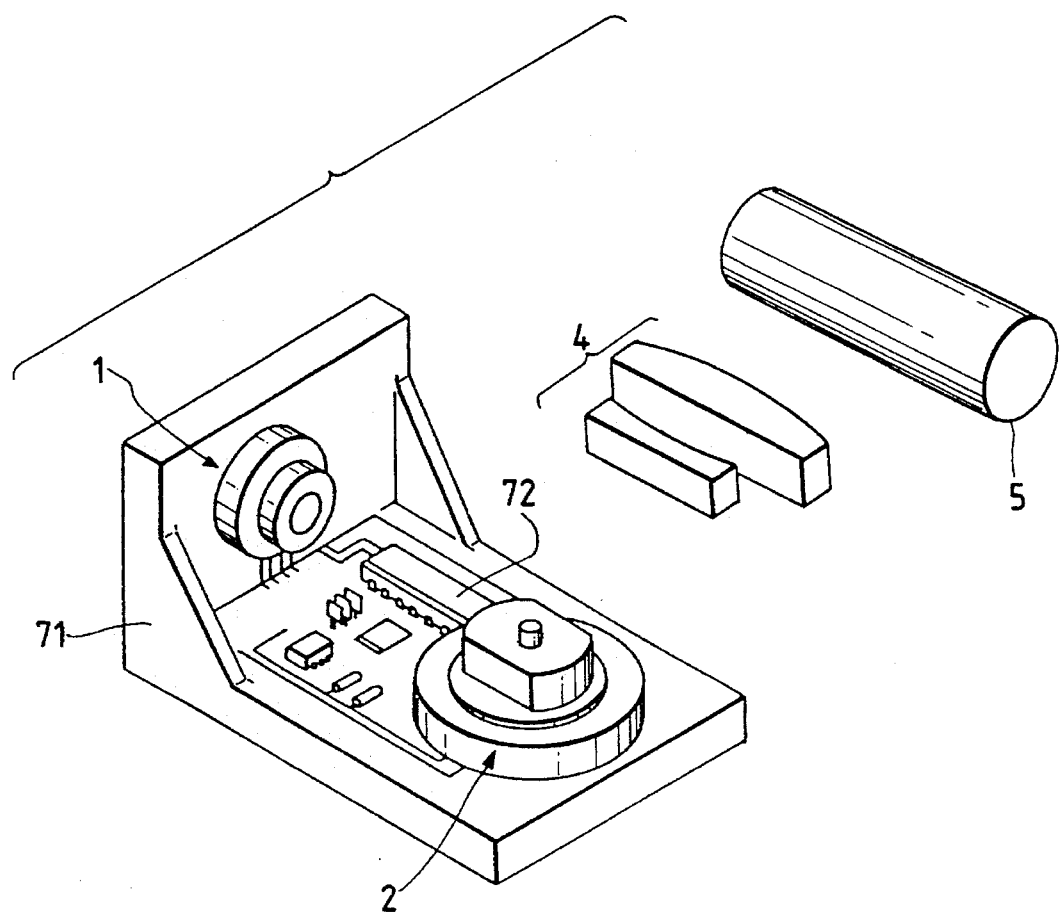
FIG. 9 is a perspective view showing a forth embodiment of an optical beam scanner according to the present invention.

FIG. 9 illustrates a fourth embodiment of an optical scanning apparatus according to the present invention, in which the laser unit 1 and the rotor unit 2 are integrally formed and installed on an L type mounting member 71, and one circuit board 72 is employed in place of the aforesaid light source circuit board 1A and scanner circuit board 2A. Here, the L type mounting member 71 is manufactured by machining an aluminum diecasting or by a resin molding of an engineering plastic. However, it is possible to machine the mounting sections for the laser unit 1 and rotor unit 2 within a precision of the normal tolerance required. This L type mounting member 71 is smaller than the conventional housing 3 and is simpler in its structure. As a result, its manufacturing is comparatively easy. In this respect, as in the case of the conventional system, the adjusting of the axes and focusings of the semiconductor laser light source 11 and the collimator lens 16 in the laser unit 1 may also be completed in advance as a matter of course.

In the fourth embodiment, while a small L type mounting member 71 is employed, the electric circuits are configurated on the same circuit board 72 instead of the light source circuit board 1A and the scanner circuit board 2A. Therefore, it is readily understandable that the wirings to a control circuit, etc. (not shown) can be reduced. In addition, it is possible to share the capacitors, etc. for the noise prevention against the power supply line for the circuitry with the result that a further compact apparatus, a higher reliability, and a further reduction of cost can be attained.

In this respect, while the circuit board 72 in the fourth embodiment is manufactured using a conventional glass epoxy board or flexible board, it is desirable to assemble the circuitry directly on the surface of the type mounting member 71. To this end, a wiring pattern can be formed by printing with an excellent precision.

Figure 10:
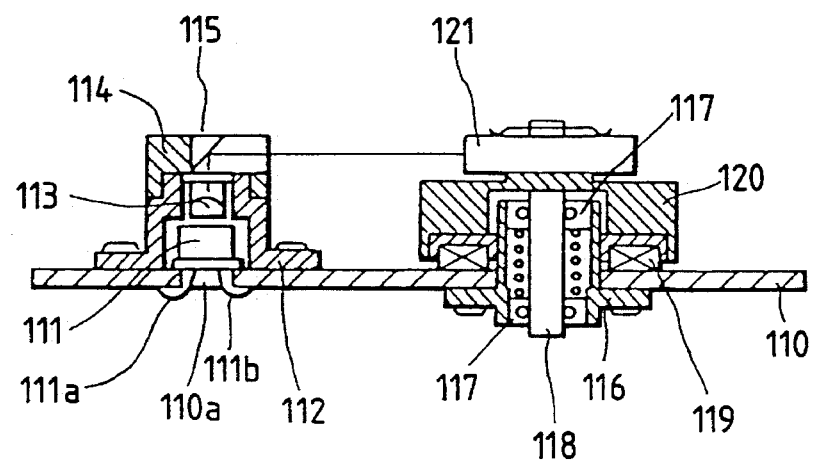
FIG. 10 is a cross-sectional view showing a fifth embodiment of an optical beam scanner according to the present invention.
Figure 11:
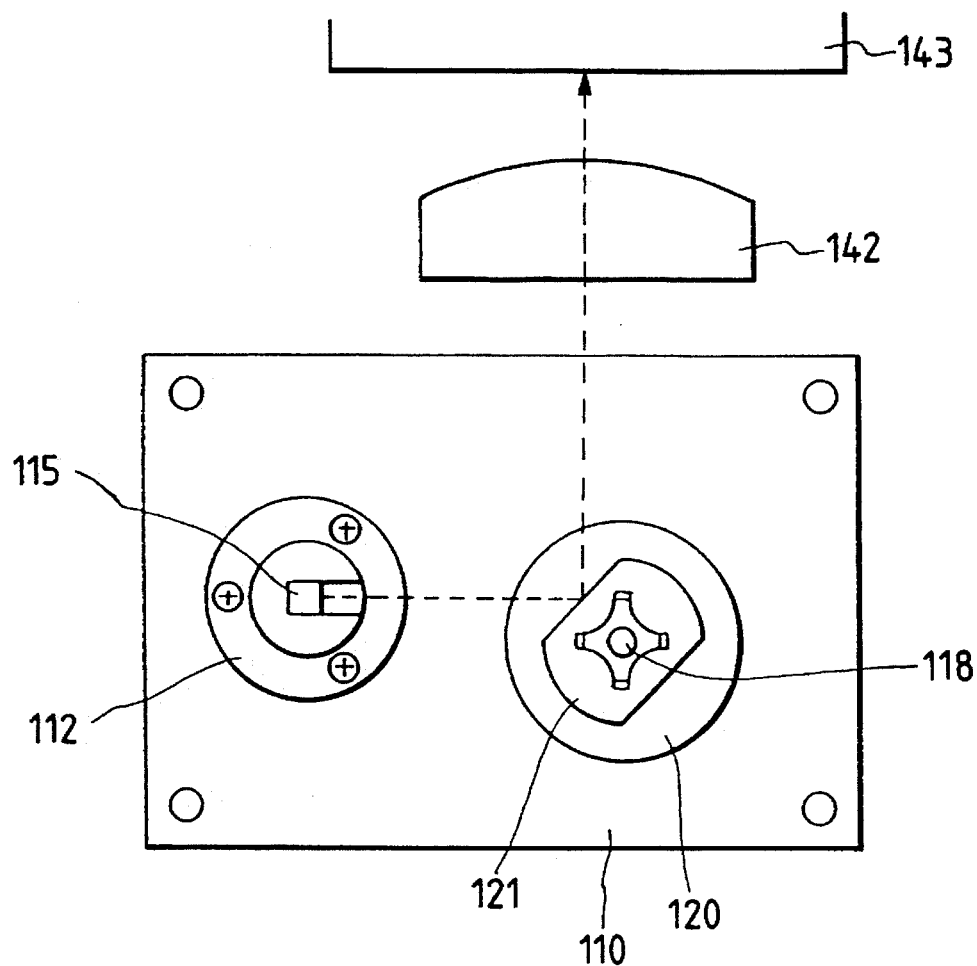
FIG. 11 is a plan view showing the aforesaid fifth embodiment.

FIG. 10 is a cross-sectional view showing a fifth embodiment of an optical scanning apparatus according to the present invention, and FIG. 11 is a plan view showing the fifth embodiment, in which an optical scanning system without using a tilt correction optical system is represented. For example, on the surface of a circuit board 110 comprising a metal board made of aluminum plate or steel plate, an optical system including a semiconductor laser light source 111 is assembled. The lead lines 111a, 111b, and 111c of the semiconductor laser light source 111 are connected to a laser light source control circuit pattern formed on the back side of the circuit board 110 through a through hole 110a. The optical system is divided into a beam emission unit and deflection unit. The beam emission unit has the semiconductor laser light source 111 installed upwards on the through hole 110a in the circuit board 110, and a lens holder 112 Which houses the semiconductor laser light source 111 is slidably installed by the range of approximately 1 mm along the circuit board 110, and is fixed after the axes of a collimator lens 113 and the semiconductor laser light source 111 have been matched. Then, the collimator lens 113, the focusing of which has been completed, is fixed to the lens holder 112. In the vicinity of the beam emission unit located above the lens holder 112, a mirror holder 114 is positioned by fitting itself onto the outer diameter of the lens holder 112 in such a manner that the mirror holder can be rotated around its axis and adjusted to position itself in the axial direction. A mirror 115 is supported by the mirror holder 114 at an angle of 45° in the direction slantly downwards.

In the deflection unit, a rotational shaft 118 is rotatably supported through two bearings 117 in the vertical direction in a housing 116 fixed to the circuit board 110. In other words, a motor is constructed by six driving coils 119 positioned in the circumference of the rotational shaft 118 and fixed to the surface of the circuit board 110 and a rotor 120 comprising plastic magnet, which is fixed to the rotational shaft 118 and positioned above the coils, and on the rotor 120, a polygon mirror 121 is mounted. Also, the driving coils 119 are coupled to a driving and controlling circuit formed on the surface of the circuit board 110. The image formation lens group which enables the scanning beam to scan and form an image on a target is provided outside the circuit board 110 while the circuit board 110 is held by a frame which is not shown in FIG. 10.

The laser beam emitted from the semiconductor laser light source 111 becomes parallel lights by the collimator lens 113 which are reflected by a mirror 115 to be directed to the polygon mirror 121. Meanwhile, the polygon mirror 121 is driven to rotate by the motor comprising the driving coils 119 and the rotor 120 so as to convert the parallel lights from the mirror 115 into a scanning beam. Hence, a photosensitive member 143 is scanned with the scanning beam at constant speed by the function of a f-θ lens 142.

When a recording is performed by the modulated laser beam under a structure such as this, the main scanning is performed on the photosensitive member 143 by the laser beam by the rotation of the polygon mirror 121 while the sub-scanning is performed by driving to rotate the photosensitive member 143 around the axis of its cylinder. Thus, an electrostatic latent image is formed! on the surface of the photosensitive member 143.

In the circumference of the photosensitive member 143, there are arranged a corona discharger for charging the surface of the photosensitive member 143 evenly; a developing device for actualizing the electrostatic latent image formed on the surface of the photosensitive member 143 into a toner image; and a transferring corona discharger (neither of them shown) for transferring the toner image to a recording sheet, and some others. With the function of these members, a recording information corresponding to the laser beam generated by the semiconductor laser light source 111 is printed on a recording sheet.

Figure 12:
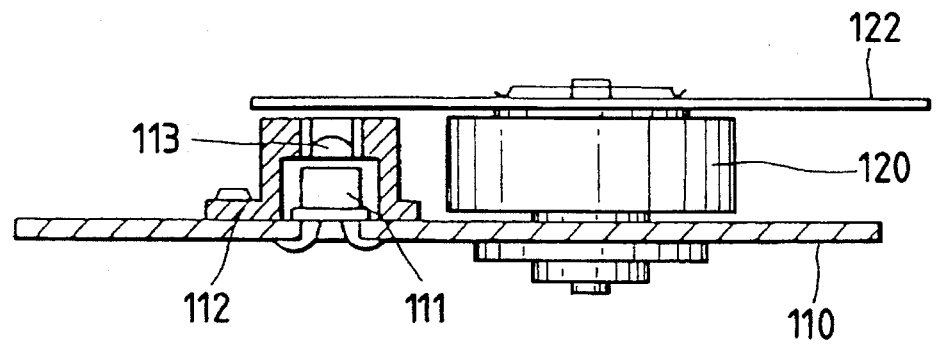
FIG. 12 is a cross-sectional view showing a sixth embodiment of an optical beam scanner according to the present invention.

FIG. 12 illustrates a sixth embodiment of an optical scanning apparatus according to the present invention, which is a cross-sectional view showing a scanning system using a hologram disc as a deflection means. Above the rotor 120, the hologram disc 122 is installed to convert the beam passing through following the rotation of the rotor 120 into the scanning beam. A collimator lens 113 is arranged in the vicinity of the beam emission unit of the semiconductor laser light source 111, and this collimator lens 113 is supported by a lens holder 112 in such a manner that the lens can be shifted in the axial direction for the adjustment and is adhesively fixed to the lens holder 112 after the focusing has been completed as in the case of the fifth embodiment described earlier. The beam emerged from the collimator lens 113 is irradiated onto the rotating hologram disc 122 and irradiated onto a target after having been converted into the scanning beam.

Figure 13:
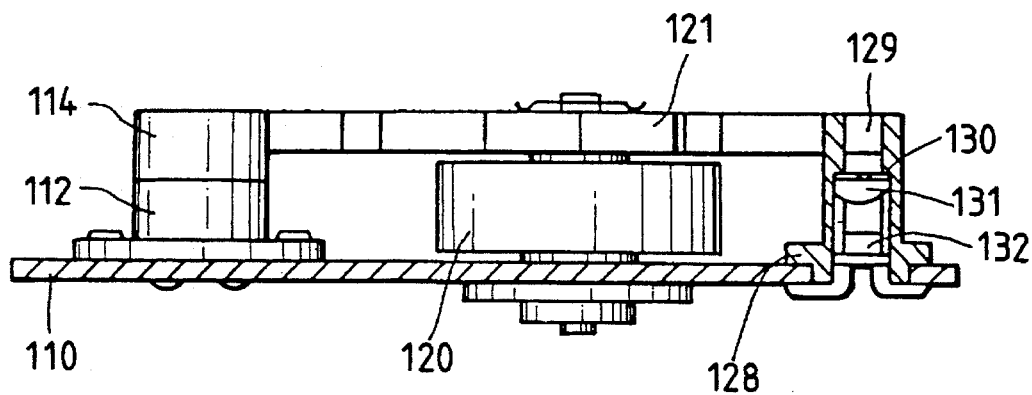
FIG. 13 is a cross-sectional view showing a seventh embodiment of an optical beam scanner according to the present invention.
Figure 14:
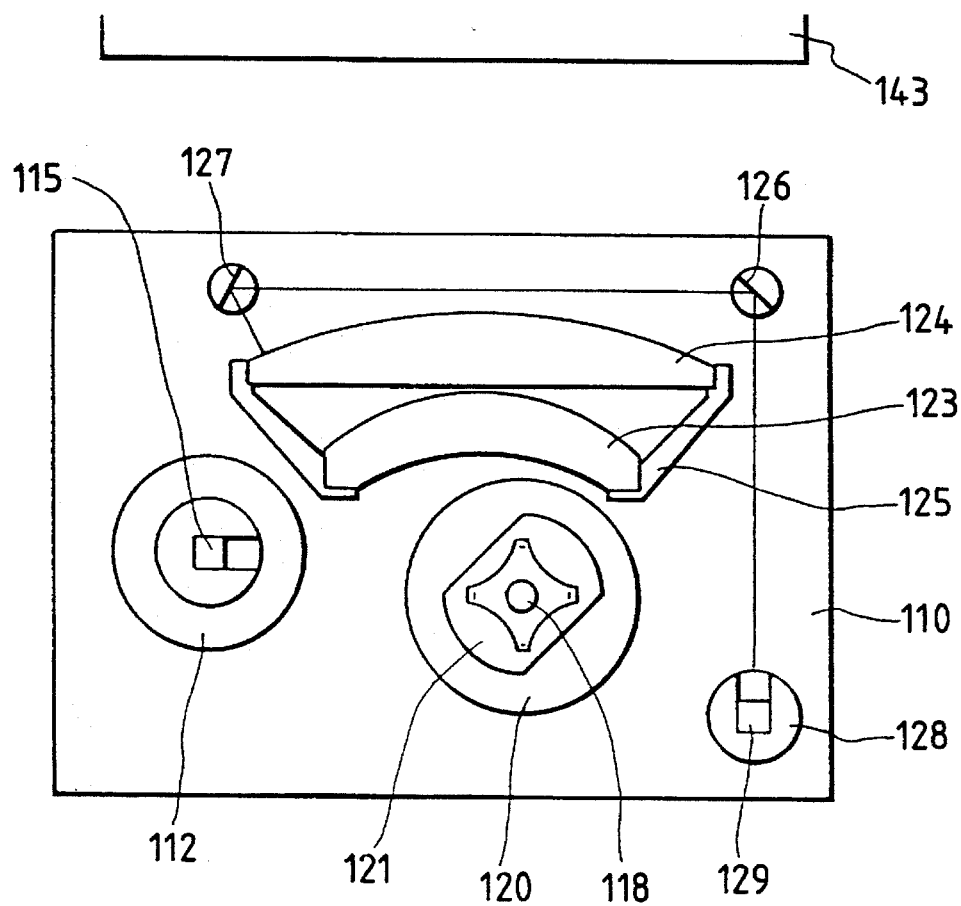
FIG. 14 is a plan view showing the aforesaid seventh embodiment.

FIG. 13 illustrates a seventh embodiment of an optical scanning apparatus according to the present invention, which is a cross-sectional view showing an assembly wherein an image formation lens group which enables the scanning beam to form an image on a target photosensitive member 143, and a beam detector for detecting horizontal synchronous signals are installed on a metal circuit board 110, and FIG. 14 is a plan view thereof. In this respect, the same reference marks appearing in FIG. 10 and FIG. 11 represent the same or equivalent members. In the seventh embodiment, an image formation unit and a detector unit are arranged on the metal circuit board 110 in addition to the beam emission unit and deflection unit described in the fifth embodiment. The image formation unit is arranged in the reflecting direction of the beam from the deflection unit, and both ends of the image formation lenses 123 and 124 are fixed to the circuit board 110 by the lens holder 125 in such a manner that the insides thereof face the deflection unit. In the vicinity of the side where the beam scanning begins by the outer image formation lens 124, a mirror 127 is rotatably fixed to the circuit board 110, and in the reflecting direction thereof, a rotary mirror 126 is likewise fixed. Further, in the reflecting direction thereof, a detector holder 128 is fixed. In the detector holder 128, a beam detection mirror 129 is held slantly downwards in the inside of its opening, and beneath thereof, a slit 130 and a lens 131 are fixed sequentially. Further beneath thereof, a detector 132 is fixed upwards, the detector being connected to a detection circuit (not shown) provided on the back side of the circuit board 110.

The beam reflected by the mirror 127 is reflected by the mirrors 126 and 129 and converged into the detector 132 by the lens 131 through the slit 130.

The detector 132 outputs signals for detecting the scanning position of the beam when the light receiving surface thereof is irradiated by the deflected scanning beam from the polygon mirror 121.

The semiconductor laser light source 111 generates the beam in response to the signal provided by a processing circuit (not shown) for processing the information from a host computer. The signal provided for the semiconductor laser light source 111 corresponds to the information to be written on the photosensitive member 143 whereby the electrostatic latent image corresponding to the desired information is formed on the photosensitive member 143. The processing circuit provides the semiconductor laser light source 111 with the signals, as one unit, for indicating the information corresponding to one scanning line which is the locus produced by the spots formed by the beam on the surface of the photosensitive member 143. Then, the signals are output in synchronization with the signals provided by the detector 132 through the line.

In other words, the detector 132 detects a synchronous signal for determining the timing of starting the modulation by the semiconductor laser light source 111.

Figure 15:
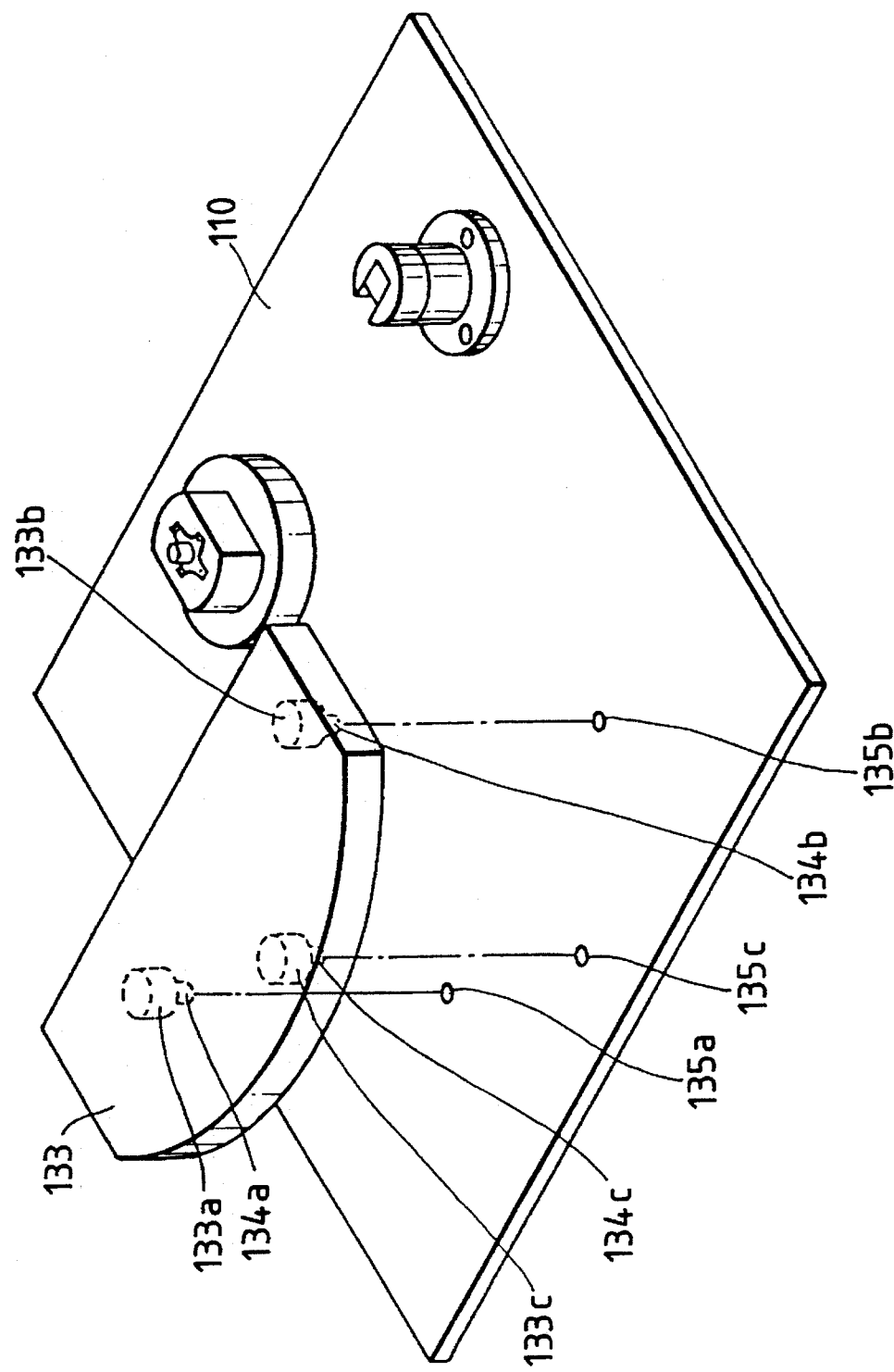
FIG. 15 is a perspective view showing a eighth embodiment of an optical beam scanner according to the present invention.

FIG. 15 is a perspective view showing the lens mounting section of an eighth embodiment wherein the image formation lens group of the embodiment shown in FIG. 13 is formed as a one plastic lens 133 and arranged on the circuit board 110. At the bottom of this plastic lens 133, three reference seates 133a, 133b, and 133c are provided with reference pins 134a, 134b, and 134c arranged to be inserted into reference lens holes 135a, 135b, and 135c of the circuit board 110. In this respect, the plastic lens 133 may also be fixed directly to the circuit board 110 using adhesives, etc.

Figure 16:
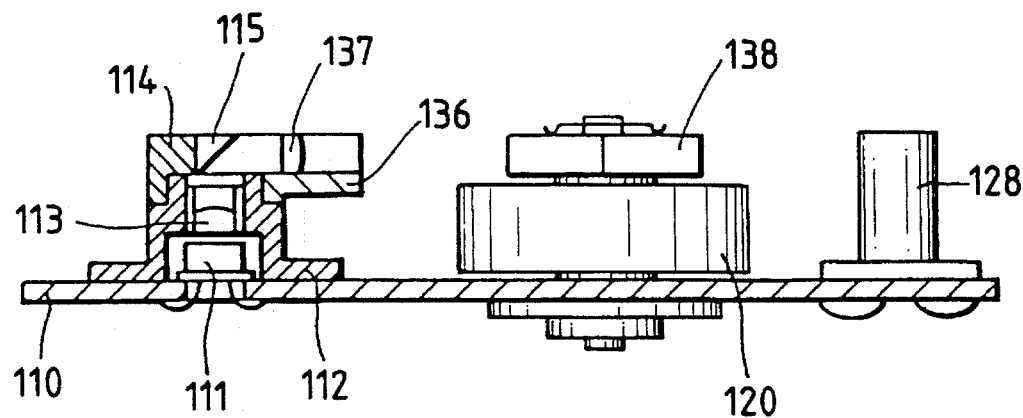
FIG. 16 is a perspective view showing a ninth embodiment of an optical beam scanner according to the present invention.
Figure 17:
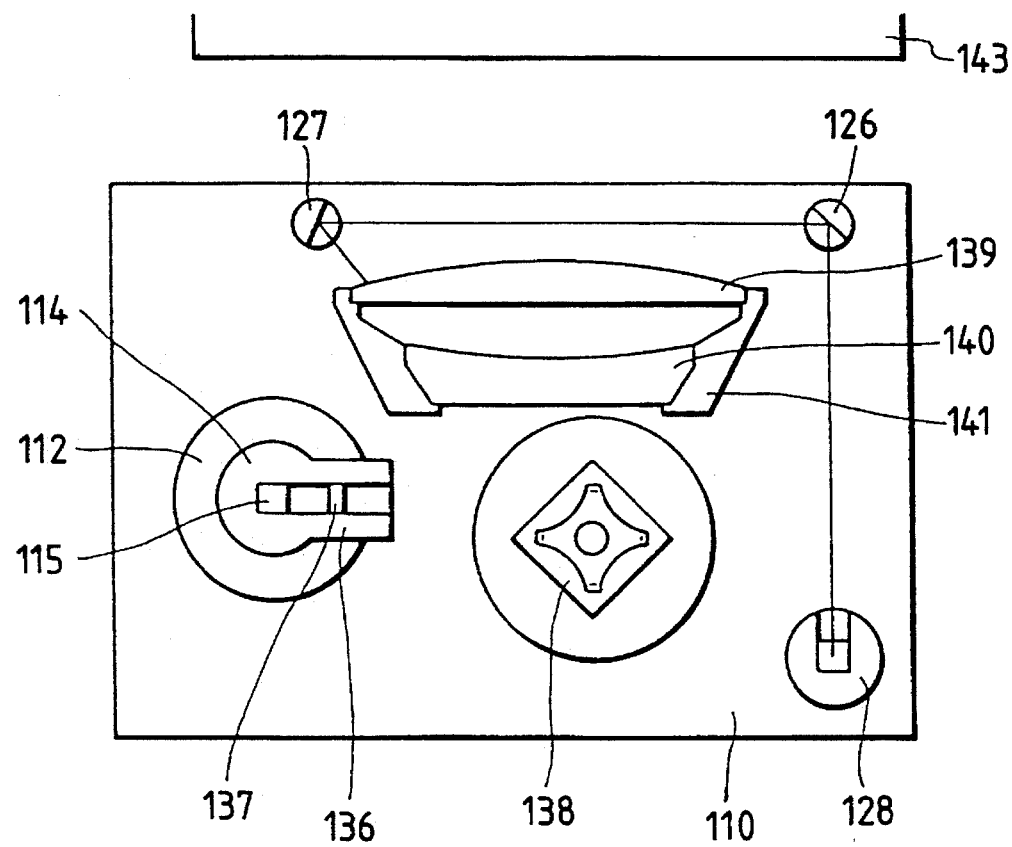
FIG. 17 is a plan view showing the aforesaid ninth embodiment.

FIG. 16 is a cross-sectional view showing a ninth embodiment of an optical scanning apparatus according to the present invention, which uses a tilt correction optical system, and FIG. 17 is a plan view thereof. In this respect, the same reference marks appearing in FIG. 13 and FIG. 14 represent the same or equivalent members. On the metal circuit board 110, a beam emission unit, deflection unit, and image formation lens group are arranged. In the vicinity of a lens holder 112 which houses the semiconductor laser light source 111 and the collimator lens 113, a mirror holder 114 and a cylindrical lens holder 136 are installed. On the mirror holder 114, a mirror 115 is held at an angle of 45° slantly downwards while on the cylindrical lens holder 136, a cylindrical lens 137 is held with its axis facing a polygon mirror having four deflection-reflection faces in such a manner that the lens is adjustable in the axial direction. A toric lens 139 and a spherical lens 140 forming an image formation lens group is held by a plastic lens holder 141, and arranged between the deflection unit on the circuit board 110 and the target photosensitive member 143.

When the light source circuit board and the scanner circuit board are formed on the same board as in this case, the large current circuit and the signal circuit are separately arranged on the front and back sides of the circuit board 110 to enhance the noise resistance and improve the reliability of the system. Further, on one side of the circuit board 110, a circuit for the motor, etc., in which a comparatively large current flows, is formed while on the other, the laser driver, processing circuit for horizontal synchronous signals etc. are formed to prevent any malfunctions due to noises. Thus, it becomes also possible to reduce the number of wirings and connectors significantly to achieve an excellent responsibility at a high speed as well as to improve both aspects of reliability and performance of the system because there is less possibility of an imperfect contact of the connectors.

As set fourth above, an optical scanning apparatus according to the present invention is of an structure such that there are provided on one and a same circuit board, a laser light source for generating laser beam; a control circuit for controlling the laser light source to emit the beam; a driving means for driving to rotate a light deflection member for deflecting the laser beam; and a driving circuit for driving the driving means.

Also, the circuit board is made of a metal board, and it is desirable to form the aforesaid control circuit and the aforesaid driving circuit on the area facing each other for the enhancement of the reliability in the mechanical strength and the noise resistance.

Also, if the image formation lenses for scanning and means for detecting horizontal synchronous signals are arranged on the board provided with the aforesaid control circuit, it is possible to make the optical scanning apparatus more compact.

As the above describes, an optical beam scanner according to the present invention is capable of making itself smaller to obtain a sufficient bending strength and precision as well as a compactness at a low cost by arranging the semiconductor laser light source and all the surrounding optical system, etc. required for scanning on the same circuit board.

We claim:

1. An optical scanning apparatus comprising:

a light source unit;

a first circuit board provided with said light source unit;

a deflector for deflecting a light beam from said light source unit;

a second circuit board provided with said deflector, including means for mechanically connecting said first and second circuit boards, and further including means for adjusting the positions of said first and second circuit boards with respect to one another; and means for electrically connecting said first and second circuit boards through a flexible board.

2. An optical scanning apparatus comprising:

a light source unit;

a light source unit driving circuit for driving said light source unit;

a deflector for deflecting a light beam from said light source unit;

a deflector driving circuit for driving said deflector; and a single circuit board on which said light source unit driving circuit and said deflector driving circuit are each mounted in a predetermined relationship.

3. An apparatus according to claim 2 wherein said single circuit board is a metallic board.

4. An optical scanning apparatus comprising:

a light source unit;

a deflector for deflecting light beam from said light source unit;

optical means for guiding the light beam deflected by said deflector in a predetermined direction, with said optical means and said light source unit each being installed in a predetermined relationship on a single circuit board of said light source unit; and light receiving means, for receiving the beam guided in said predetermined direction by said optical means.

5. A method for installing circuit boards on an optical scanning apparatus, said method comprising:

a step for mechanically mounting a light source unit on a light source driving circuit board;

a step for mechanically mounting a deflector, for deflecting light beam from said light source unit, on a deflector driving circuit board;

a step for electrically connecting said light source driving circuit board and said deflector driving circuit board through a flexible board;

a step for mechanically connecting said light source driving circuit board and said deflector driving circuit board; and a step for mechanically adjusting the position of said light source driving circuit board and said deflector driving circuit with respect to one another.

6. A method for installing circuit boards on an optical scanning apparatus, said method comprising:

a step for mechanically mounting a light source unit on a first circuit board;

a step for mechanically mounting a deflector, for deflecting light beam from said light source unit, on a second circuit board;

a step for electrically connecting said first circuit board and said second circuit board through a flexible board;

a step for mechanically connecting said first circuit board and said second circuit board; and a step for mechanically adjusting the position of said first circuit board and said second circuit board with respect to one another.

7. A recording apparatus comprising:

a light source unit;

a first circuit board provided with said light source unit;

a deflector for deflecting light beam from said light source unit;

a second circuit board provided with said deflector, including means for mechanically connecting said first and second circuit boards, and further including means for adjusting the position of said first and second circuit boards with respect to one another;

means for electrically connecting said first and second circuit boards through a flexible board; and a recording medium for receiving the light beam deflected by said deflector.

8. A recording apparatus comprising:

a light source unit;

a light source unit driving circuit for driving said light source unit;

a deflector for deflecting light beam from said light source unit;

a recording medium for receiving the light beam deflected by said deflector;

a deflector driving circuit for driving said deflector; and a single circuit board on which said light source unit driving circuit and said deflector driving circuit are each mounted in a predetermined relationship.

9. A recording apparatus comprising:

a light source unit;

a deflector for deflecting light beam from said light source unit;

a recording medium;

optical means for guiding the light beam deflected by said deflector to said recording medium, with said optical means and said light source unit each being installed in a predetermined relationship on a single circuit board of said light source unit; and light receiving means for receiving the light beam guided in a predetermined direction by said optical means.

10. An apparatus according to claim 2, further comprising light receiving means for receiving the light beam deflected by said deflector and installed on said single circuit board.

11. An apparatus according to claim 10, wherein said light receiving means detects a synchronous signal for determining a timing of starting modulation of said light source unit.

12. An apparatus according to claim 4, wherein said single circuit board comprises a metallic board.

13. An apparatus according to claim. 4, further comprising light receiving means for receiving the light beam deflected by said deflector and installed on said single circuit board.

14. An apparatus according to claim 13, wherein said light receiving means detects a synchronous signal for determining a timing of starting modulation of said light source unit.

15. An apparatus according to claim 8, wherein said circuit board comprises a metallic board.

16. An apparatus according to claim 8, further comprising light receiving means for receiving the light beam deflected by said deflector and installed on said single circuit board.

17. An apparatus according to claim 16, wherein said light receiving means detects a synchronous signal for determining a timing of starting modulation of said light source unit.

18. An apparatus according to claim 9, wherein said single circuit board comprises a metallic board.

19. An apparatus according to claim 9, further comprising light receiving means for receiving the light beam deflected by said deflector and installed on said single circuit board.

20. An apparatus according to claim 19, wherein said light receiving means detects a synchronous signal for determining a timing of starting modulation of said light source unit.

21. An optical scanning apparatus comprising:

a light source unit;

a light source unit driving circuit for driving said light source unit;

a deflector for deflecting a light beam from said light source unit;

a deflector driving circuit for driving said deflector; and light receiving means for receiving the light beam deflected by said deflector, said light receiving means being mounted on a circuit board of said light source unit driving circuit.

22. An apparatus according to claim 21, wherein said circuit board of said light source unit driving circuit is a metallic board.

23. An apparatus according to claim 21, wherein said light receiving means detects a synchronous signal for determining a timing for starting modulation of said light source unit.

24. A recording apparatus comprising:

a light source unit;

a light source unit driving circuit for driving said light source unit;

a deflector for deflecting a light beam from said light source unit;

a deflector driving circuit for driving said deflector;

a recording medium for receiving the light beam deflected by said deflector; and a light detector for receiving the light beam deflected by said deflector, said light detector being mounted on a circuit board of said light source unit driving circuit.

25. An apparatus according to claims 24, wherein said circuit board of said light source unit driving circuit is a metallic board.

26. An apparatus according to claim 24, wherein said light detector detects a synchronous signal for determining a timing for starting modulation of said light source unit.

27. An optical scanning apparatus comprising:

a light source unit;

a light source unit driving circuit for driving said light source unit;

a deflector for deflecting a light beam from said light source unit;

a deflector driving circuit for driving said deflector;

optical means for guiding the light beam deflected by said deflector in a predetermined direction, said optical means being mounted on a circuit board of said light source unit driving circuit; and light receiving means for receiving the light beam guided in said predetermined direction by said optical means.

28. An apparatus according to claim 27, wherein said circuit board of said light source unit driving circuit is a metallic board.

29. An apparatus according to claim 27, wherein said light receiving means detects a synchronous signal for determining a timing for starting modulation of said light source unit.

30. A recording apparatus comprising:

a light source unit;

a light source unit driving circuit for driving said light source unit;

a deflector for deflecting a light beam from said light source unit;

a deflector driving circuit for driving said deflector;

a recording medium for receiving the light beam deflected by said deflector;

optical means for guiding the light beam deflected by said deflector in a predetermined direction, said optical means being mounted on a circuit board of said light source unit driving circuit; and a light detector for receiving the light beam guided in said predetermined direction by said optical means.

31. An apparatus according to claim 30, wherein said circuit board of said light source unit driving circuit is a metallic board.

32. An apparatus according to claim 30, wherein said light detector detects a synchronous signal for determining a timing for starting modulation of said light source unit.

33. An optical scanning apparatus comprising:

a light source unit;

a deflector for deflecting a light beam from said light source unit;

optical means for guiding the light beam deflected by said deflector in a predetermined direction; and light receiving means for receiving the light beam guided in said predetermined direction by said optical means, said light receiving means being mounted on a circuit board of said light source unit.

34. An apparatus according to claim 33, wherein said circuit board of said light source unit is a metallic board.

35. An apparatus according to claim 33, wherein said light receiving means detects a synchronous signal for determining a timing for starting modulation of said light source unit.

36. A recording apparatus comprising:

a light source unit;

a deflector for deflecting a light beam from said light source unit;

a recording medium for receiving the light beam deflected by said deflector;

optical means for guiding the light beam deflected by said deflector in a predetermined direction; and a light detector for receiving the light beam guided in said predetermined direction by said optical means, said light detector being mounted on a circuit board of said light source unit.

37. An apparatus according to claim 36, wherein said circuit board of said light source unit is a metallic board.

38. An apparatus according to claim 36, wherein said light detector detects a synchronous signal for determining a timing for starting modulation of said light source unit.

39. An optical scanning apparatus comprising:

a light source unit;

a deflector for deflecting a light beam from said light source unit;

optical means for guiding the light beam from said light source unit in a predetermined direction, said optical means being mounted on a circuit board of said light source unit; and light receiving means for receiving the light beam deflected by said deflector.

40. An apparatus according to claims 39, wherein said circuit board of said light source unit is a metallic board.

41. An apparatus according to claim 39, wherein said light receiving means detects a synchronous signal for determining a timing for starting modulation of said light source unit.

42. A recording apparatus comprising:

a light source unit;

a deflector for deflecting a light beam from said light source unit;

a recording medium for receiving the light beam deflected by said deflector;

optical means for guiding the light beam from said light source unit in a predetermined direction, said optical means being mounted on a circuit board of said light source unit; and a light detector for receiving the light beam deflected by said deflector.

43. An apparatus according to claim 42, wherein said circuit board of said light source unit is a metallic board.

44. An apparatus according to claim 42, wherein said light detector detects a synchronous signal for determining a timing for starting modulation of said light source unit.

* * * * *